United States Patent [19]

Koontz et al.

[11] 4,093,520

[45] June 6, 1978

[54] PROCESS FOR GOLD PLATING

[75] Inventors: Donald Eldridge Koontz; Uziel Landau, both of Summit, N.J.

[73] Assignee: Bell Telephone Laboratories, Incorporated, Murray Hill, N.J.

[21] Appl. No.: 817,267

[22] Filed: Jul. 20, 1977

Related U.S. Application Data

[63] Continuation of Ser. No. 658,702, Feb. 17, 1976, abandoned.

[51] Int. Cl.² .................. C25D 5/02; C25D 5/08; C25D 5/16
[52] U.S. Cl. .................................. 204/15; 204/224 R
[58] Field of Search ................. 204/15, 224 R, 273, 204/275

[56] References Cited

U.S. PATENT DOCUMENTS

| | | | |
|---|---|---|---|
| 1,411,657 | 4/1922 | Duncan | 204/273 |
| 2,505,531 | 4/1950 | Ellwood | 204/297 M |
| 3,644,181 | 2/1972 | Donaldson | 204/224 |
| 3,880,725 | 4/1975 | Van Raalte | 204/DIG. 7 |
| 3,933,615 | 1/1976 | Levenson | 204/275 |

FOREIGN PATENT DOCUMENTS 574,316  3/1933  Germany .................. 204/15

Primary Examiner—T. M. Tufariello
Attorney, Agent, or Firm—Walter G. Nilsen

[57] ABSTRACT

The invention is a process for rapidly electroplating certain metals such as gold, nickel, tin-nickel and tin-lead alloys on contact fingers for electronic printed wiring boards. Particularly important is uniform distribution of current amongst the fingers so as to produce uniform metal platings with equal thickness. Also of importance is the provision to alter thickness among the individual fingers so as to plate metal where most needed for particular applications. Uniform and rapid plating are achieved by certain circuit designs together with high parallel flow rates of electroplating solution in the electroplating cell. Both electroplating uniformity and provision for selecting thickness for individual fingers permits savings in amounts of metal used without sacrifices in performance. This is particularly important in the case of gold electroplating because of the high cost and increasing use of gold.

5 Claims, 2 Drawing Figures

PROCESS FOR GOLD PLATING

This application is a continuation of application Ser. No. 658,702, filed Feb. 17, 1976 now abandoned.

BACKGROUND OF THE INVENTION

1. Field of the Invention

The invention relates to a process for electroplating certain metals including gold, gold alloys, nickel and tin-lead.

2. Description of the Prior Art

Gold electroplating processes have many important industrial applications. Particularly important, especially in recent years, is the application of gold plating processes to the manufacture of electronic circuits. Because of its electrical conductivity properties and the fact that it does not form a surface insulating layer, gold is especially useful as a conductor in electrical circuits as well as a surface metal in electrical contacting areas. Because of the extensive use of gold in electrical circuits as well as its high cost, it is advantageous to conserve as much as possible the amount of gold used in a particular application without sacrificing in the quality of the electronic circuits.

In present practice contact fingers in electronic circuits are electrically connected together by a bus wire and gold electroplated as one plating surface. The variation in the uniformity and thickness of such gold platings is quite large which requires thicker plating to insure minimum coverage on all fingers. Further, contact fingers which are not going to be used in a particular application as well as the bus wire which is subsequently removed from the board and discarded receive the same or greater thickness of gold as the contacts which are to be used. This is again wasteful of gold. Considering the increasing use and cost of gold, it is highly desirable to reduce the amount of gold used without sacrifice in the quality of device produced.

SUMMARY OF THE INVENTION

The invention is a process for electroplating various metals and alloys such as gold, gold alloys, nickel, tin-nickel and tin-lead alloys on contact fingers of electronic printed wiring boards. The process is carried out under conditions which insure uniform distribution of metal plating among the fingers. Thus, it is preferred that a resistance of between 10 and 10,000 ohms be inserted in series with the plated finger. Also, parallel flow rates from 10 cm/sec to 800 cm/sec are preferred. Metal platings may be limited on fingers not to be used by reducing the plating time for that finger or reducing the current or both. The inventive process not only produces metal platings very rapidly but the metal platings are of good quality suitable for electronic applications. Although the invention applies to a variety of metals and alloys including those set forth above, it is particularly advantageous for gold and gold alloys. The high cost of gold makes more advantageous use of this metal by more uniform plating from finger to finger and reduced use on fingers not to be used in a particular application of prime economic importance. Also, gold is most extensively used in high quality connectors on electronic circuit boards and therefore is of the greatest commercial importance.

DETAILED DESCRIPTION

Figure 1:
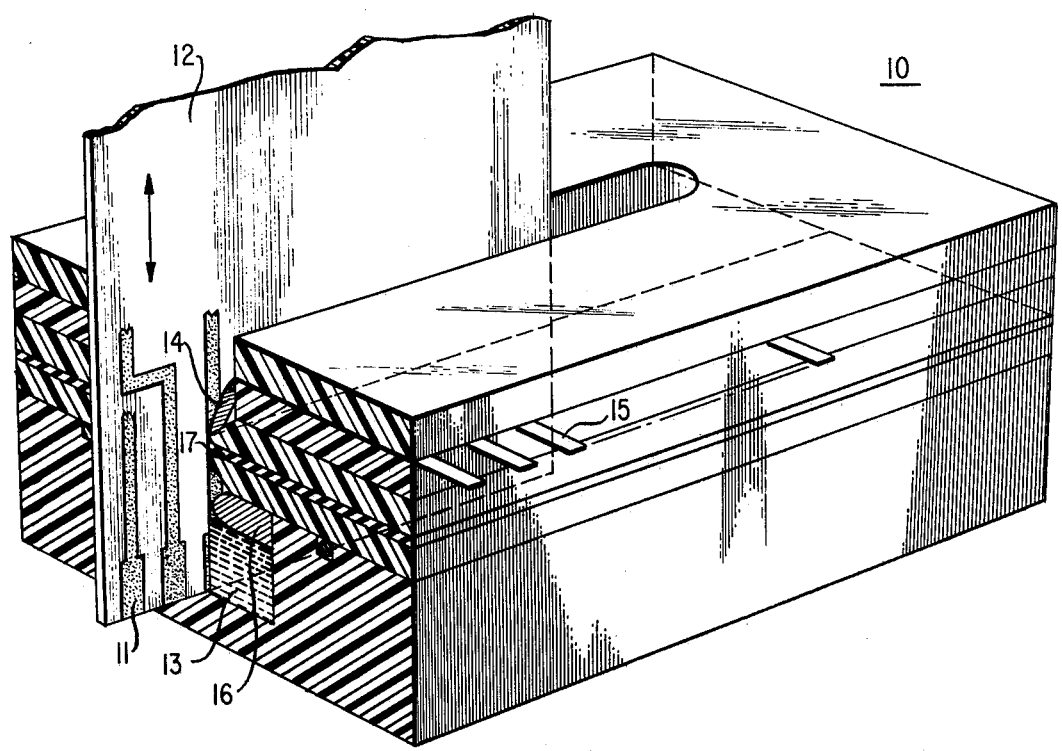
FIG. 1 is a perspective view of a high speed plating cell showing the narrow channel through which the electroplating solution is pumped and printed wiring board being inserted into a high speed plating cell.

The invention involves a particular combination of process parameters which produces fault-free uniform metal platings at high deposition rates with a minimum of metal plating solution. Both hard and soft gold in addition to nickel, tin-nickel and tin-lead may be plated using the inventive process. Soft gold is essentially pure gold whereas hard gold contains hardeners such as cobalt, nickel, arsenic, etc. Particularly important are soft and hard gold because of extensive usage in electronic circuit manufacture and the extensive economic savings possible by use of smaller amounts of gold plating solution and less gold metal.

Other advantages accrue from the fact that plating may be carried out as a last series of steps in the manufacture of a circuit board. First, only good boards free from defects are plated. Second, hard layers such as hard gold and tin-nickel which crack in subsequent procesing such as removal of the bus wire can be plated. Third, since no subsequent operations are carried out on the circuit board, there is little danger of damage to the finger plating.

In the plating process, individual fingers are connected to the plating power supply. An external resistance is in series with each finger being plated. Each resistance should have a value between 10 and 10,000 ohms such that they are the controlling resistances in the plating circuit to each finger. This resistance is used to insure uniform plating from finger to finger (where resistances are the same from finger to finger) and may be varied from finger to finger to adjust the amount of metal deposited on each finger. Generally, it is desirable that fingers to be used in a particular application receive the same thickness of gold and those not used to receive a very thin coat of gold to prevent corrosion. Although the process gives satisfactory results with resistances outside the range 10–10,000 ohms, below 10 ohms uniformity from finger to finger is sometimes such as to be wasteful of gold. Above 10,000 ohms, excess power is dissipated without any improvement in uniformity. It should be realized that lack of uniformity in the deposition of gold from finger to finger is wasteful of gold since a minimum requirement of gold on one finger requires excess gold on other fingers. The preferred resistance range from the point of view of maximum uniformity without excessive power dissipation or the need for excessively large power equipment is 100–400 ohms.

Highly uniform metal distribution (both from finger to finger and within each finger) and high-quality, flaw-free platings are made possible by the use of high flow rates of the plating solution parallel to the surfce being plated. Flow rates of 10 to 800 cm/sec are convenient for the practice of the process. Flow rates between 50 and 500 cm/sec are preferred because uniform, rapid platings are obtained without excessive flow rates. Flow rates between 100 and 200 cm/sec give exceptionally good results. To insure high parallel flow rates without excessively large flow volumes, channel dimensions in the plating cell should be narrow, preferably from 0.3 and 20 cm² in cross section.

Current densities may vary over large limits. Preferred limits which yield plating either free of faults or with very few faults depends on the alloy or metal being plated. The preferred current density for soft gold is 20–100 ma/cm², for hard gold is 50–300, for tin-nickel is 50–500 ma/cm², for nickel is 50–700 and for tin-lead solder is 100–1000 ma/cm². Under manufacturing conditions where rapid plating and power conservation is important, a current density of 70–100 is used for hard gold. This yields plating rates of up to 150 microinches per minute with excellent quality platings free from pits, voids, and highly uniform. Soft and hard gold yield particularly good results and the process may be used both on new circuit boards and to repair old or defective boards.

The plating system consists of two types of equipment, namely, the circulation system and the electrical equipment. The circulation system is made up of the plating cell and the pumping equipment. The electrical equipment is made up of the power supply and the process control electronics.

A typical plating cell 10 with inserted circuit board is shown in FIG. 1. The plating cell is provided with a 7 inch long flow channel made of lucite with a 1.1 by 0.75 centimeter clearance for solution flow. The fingers 11 are shown on the circuit board 12 which is inserted into the electroplating solution 13 in the cell. The contact assembly which makes electrical contact to the individual fingers consist of two rows (back and front of the board) of contact springs 14 mounted on top of the channel leads which make contact with the upper portion of the fingers. The contact springs extend outside the cell 15 for electrical connection to the power supply. The anode 16 is usually immersed in the electroplating solution. These particular anodes (one on each side of the board) are made of platinum. The anode may consist of other materials often depending on the material being plated. For example, platinized titanium or tantalum may be used for gold and tin-nickel plating, nickel anode for nickel plating and tin-lead anodes for tin-lead plating. A silicone rubber gasket 17 is used to seal the circuit board 12 into the electroplating cell so that electroplating solution does not leak out. Various stop mechanisms are used to prevent possible damage to soft gaskets by overexertion.

High circulation rates are provided by a self-enclosed centrifugal pump magnetically coupled to an electric motor. The pump is made entirely of plastic materials to prevent metallic contamination of the solution. A storage tank is also provided which is made typically of polyethylene and contains approximately one gallon of plating solution. Stirring and heating where desired may be provided with conventional means.

Figure 2:
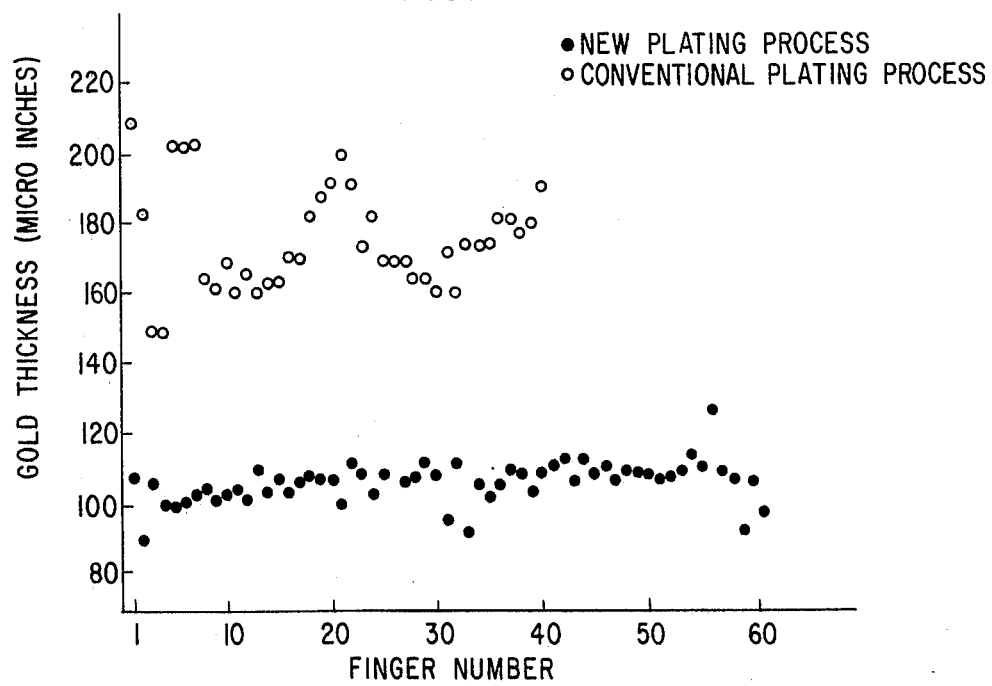
FIG. 2 is a graph of plating thickness data showing the dependence of plating thickness on finger position for conventional plating procedure and the inventive plating process.

FIG. 2 shows the results of some plating experiments on a typical printed wire board carried out in accordance with the invention (solid points on the graph). These results are compared with a conventional plating process. The new plating process was carried out at a rate of 100 microinches per minute in a cell like that shown in FIG. 1. It should be noticed that the plating thickness from finger to finger is highly uniform which permits thinner plating on each finger since deviations below the minimum thickness required is less likely.

Typical compositions for plating solutions are as follows:

1. Hard Gold

Potassium gold cyanide $KAu(CN)_2$: 12–46 gm/l
Citric acid anhydrous: 80–120 gm/l
KOH: 4–6 gm/l
Cobalt citrate: 100–200 ppm 2. Hard Gold Potassium gold cyanide: 12–46 gm/l
Phosphoric acid to adjust pH to approximately 4.2
Cobalt citrate: 100–200 ppm 3. Soft Gold Potassium gold cyanide: 12–46 gm/l
Potassium hydrogen phosphate: 40 gm/l
Potassium dihydrogen phosphate: 10 gm/l
  This yields a solution with pH approximately 7.0 and plating should be carried out at a temperature of approximately 65° C.

4. Soft Gold

Potassium gold cyanide: 20 gm/l
$(NH_4)_2 HC_6H_5O_7$: 50 gm/l
pH 5 – 6.5 plating temperature approximately 65° C.

5. Nickel $NiSO_4 \cdot 6H_2O$: 225 gm/l
$NiCl_2 \cdot 6H_2O$: 60 gm/l
$H_3BO_3$: 37.5 gm/l
$H_2SO_4$ to adjust pH to 2.0 – 4.0

6. Nickel $Ni(NH_2SO_3)_2$: 450 gm/l
Boric Acid, $H_3BO_3$: 30 gm/l
Sulfamic acid to adjust pH to 3.0 – 5.0
Water 7. Tin Nickel $SnCl_2$: 48.75 gm/l
Nickel chloride $NiCl_2 \cdot 6H_2O$: 300 gm/l
Ammonium biflouride $NH_4HF_2$: 56 gm/l
$NH_4OH$ to adjust pH to 2.0 – 2.5
$NH_4Cl$: 60 gm/l 8. Tin Lead $SnCl_2$: 37.5 gm/l
Lead: 90 gm/l
$H_3BF_4$: 85 gm/l Other typical solutions which are useful in the inventive procedure may be found in the book, *Modern Electroplating*, edited by F. A. Lowenheim, John Wiley & Sons, New York, third edition.

What is claimed is:
1. A process for electroplating metals and alloys selected from the group consisting of soft gold, hard gold, nickel, tin-nickel, and tin-lead on surfaces comprising the step of:
  passing current from an electrical energy source through an anode, plating solution and cathode with surfaces to be plated as part of the cathode in which electrical resistors are located outside the plating solution and in series between the electrical energy source and the surfaces to be plated and in which plating solution is pumped through a plating cell so that plating solution flows parallel to the surface to be plated with a given parallel flow rate characterized in that (a) the electrical resistance is between 10 and 10,000 ohms;
(b) the flow rate of the plating solution parallel to the surface being plated is between 10 cm/sec and 800 cm/sec; and
(c) the current density is between 50–300 ma/cm² for hard gold, so as to produce uniform, predetermined plating thickness.

2. The process of claim 1 in which the resistance in series with the surface being plated is between 100 and 400 ohms.

3. The process of claim 1 in which the flow rates of the electroplating solution parallel to the surface being plated is between 100 and 200 cm/sec.

4. The process of claim 1 in which the current density is 80–120 ma/cm² for hard gold plating.

5. The process of claim 1 in which the channel dimensions of the plating cell in cross section perpendicular to the direction of flow of the electroplating solution is between 0.3 and 20 cm².

* * * * *